United States Patent [19]
Ushida

[11] 4,254,378
[45] Mar. 3, 1981

[54] MODIFIED FOSTER-SEELEY FREQUENCY DISCRIMINATOR

[75] Inventor: Susumu Ushida, Soma, Japan

[73] Assignee: Burroughs Corporation, Detroit, Mich.

[21] Appl. No.: 9,297

[22] Filed: Feb. 5, 1979

[30] Foreign Application Priority Data

Feb. 8, 1978 [JP] Japan .............................. 53-14690[U]

[51] Int. Cl.³ .......................................... H03D 3/08
[52] U.S. Cl. ..................................... 329/137; 329/143
[58] Field of Search ............... 329/110, 137, 138, 139, 329/140, 141, 143, 142; 455/214, 337; 307/233 R; 328/140

[56] References Cited
U.S. PATENT DOCUMENTS

| 2,243,417 | 5/1941 | Crosby | 329/141 |
| 3,621,409 | 11/1971 | Segawa | 329/110 |

*Primary Examiner*—Siegfried H. Grimm
*Attorney, Agent, or Firm*—Carl Fissell, Jr.; Charles E. Quarton; K. R. Peterson

[57] ABSTRACT

In a Foster-Seeley discriminator circuit having a discriminating resonance circuit, resonance circuits having series resonance characteristics are respectively connected between a signal source and both ends of the discriminating resonance circuit so as to raise the level of a composite output voltage of the frequency discriminator circuit, whereby the sensitivity of the output voltage versus the frequency can be enhanced.

7 Claims, 2 Drawing Figures

MODIFIED FOSTER-SEELEY FREQUENCY DISCRIMINATOR

BACKGROUND OF THE INVENTION

This invention relates to frequency discriminator circuits. More particularly, it relates to improvements in a gradient in the vicinity of a center frequency in the S-shaped characteristic of the frequency discriminator circuit, that is, improvements in the sensitivity of the output voltage versus the frequency.

Heretofore, the output voltage versus frequency-sensitivity in the vicinity of a center frequency has been low in conventional frequency discriminator circuits. This has led to the disadvantage that the exactitude of a frequency adjustment is inferior in the automatic frequency control of a local oscillator circuit such as that in a television tuner.

SUMMARY OF THE INVENTION

In view of the disadvantage described above, this invention has for its object to provide a frequency discriminator circuit which enhances the output voltage versus frequency-sensitivity in the vicinity of the center frequency merely by adding simple circuitry to the prior-art frequency discriminator circuit.

In one aspect of performance of this invention, a Foster-Seeley discriminator circuit having a discriminating resonance circuit is improved by including a first resonance circuit connected between one end of said discriminating resonance circuit and a signal source, and a second resonance circuit connected between the other end of said discriminating resonance circuit and said signal source.

Hereunder, description will be made with reference to the drawings.

BRIEF DESCRIPTION OF THE DRAWINGS

FIG. 1(a) is a circuit diagram of a prior-art Foster-Seeley discriminator circuit, while FIG. 1(b) is a graph illustrative of the characteristic of the discriminator circuit shown in FIG. 1(a).

DETAILED DESCRIPTION OF THE INVENTION

Figure 1:
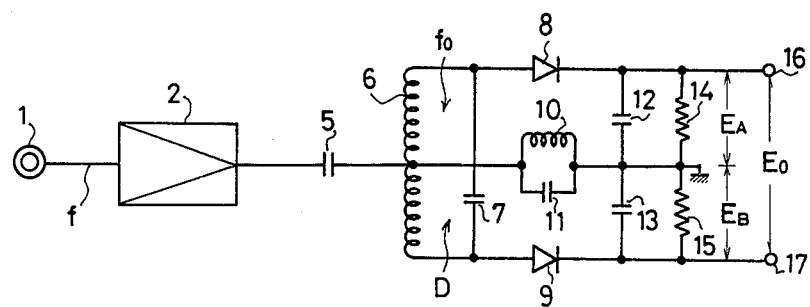
Figure 1:
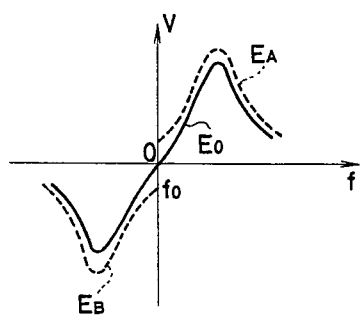

Before describing a preferred embodiment of this invention, a prior-art discriminator circuit will be explained. FIG. 1(a) shows the conventional Foster-Seeley discriminator circuit. An input signal received at an input terminal 1 is amplified by an amplifier circuit 2. Through a coupling capacitor 5, the amplified signal is led to a discriminating resonance circuit D which is comprised of coil 6 and a capacitor 7. The discriminating resonance circuit D exhibits a resonance characteristic having a center frequency $f_0$. Signals from the discriminating resonance circuit D are detected by diodes 8 and 9, and are delivered to output terminals 16 and 17 through a coil 10, a capacitor 11, capacitors 12 and 13 and resistors 14 and 15.

FIG. 1(b) is a graph showing the characteristic of the Foster-Seeley discriminator circuit in FIG. 1(a). A composite output voltage $E_o$ is the sum between D.C. output voltages $E_A$ and $E_B$. As seen from the graph, the so-called S-shaped characteristic is demonstrated around the center frequency $f_0$, and the function of the frequency discriminator circuit is effected. With the frequency discriminator circuit, it has been difficult in various respects to augment the gradient of the S-shaped characteristic near the center frequency $f_0$, in other words, to enhance the sensitivity of the output voltage versus the frequency. As an expedient, there has been a method wherein the gain of the amplifier circuit 2 is made high and wherein the output voltage is sliced. In this case, however, the stability of the circuit is degraded with the increase of the gain and the slice level adjustment is complicated in addition to the problem of the rise of cost.

Now, the present invention will be described with reference to FIG. 2 showing an embodiment thereof.

Figure 2A:
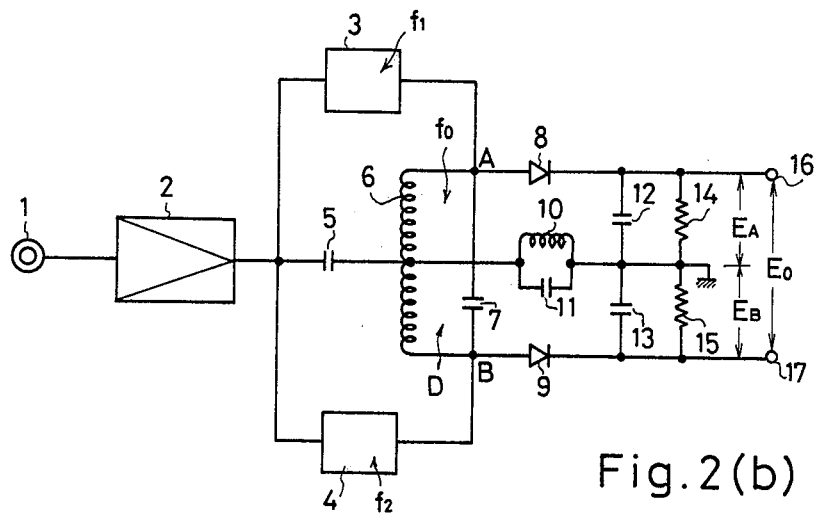
FIG. 2(a) is a circuit diagram of a Foster-Seeley discriminator circuit embodying the present invention.

In FIG. 2(a), the same symbols as in FIG. 1(a) indicate the same parts. The output of the amplifier circuit 2 is led to the discriminating resonance circuit D by the coupling capacitor 5. Simultaneously, it is led to both ends A and B of the discriminating resonance circuit D through series resonance circuits 3 and 4, respectively. Each of the series resonance circuits 3 and 4 is constructed of, for example, a series connection consisting of a coil and a capacitor as shown by the circuit 18 in FIG. 2(b). The resonance frequency $f_1$ of the series resonance circuit 3 is set to be higher than the center frequency $f_0$ of the discriminating resonance circuit D, while the resonance frequency $f_2$ of the series resonance circuit 4 is set to be lower than the center frequency $f_0$. The frequencies $f_1$, $f_2$ and $f_0$ have the following relationship:

$$f_1 - f_0 = f_0 - f_2$$

In the embodiment, shown in FIG. 2(a) the detector diodes 8 and 9 receive signals which are led through the coupling capacitor 5 and the discriminating resonance circuit D from the amplifier circuit 2 and signals which are led through the series resonance circuits 3 and 4. Accordingly, the D.C. output voltage $E_A$ or $E_B$ of the output terminal 16 or 17 becomes the sum between the component $E_1'$ or $E_2'$ conducted through the coupling capacitor 5 and the component $E_1$ or $E_2$ conducted through the series resonance circuit 3 or 4, respectively. As illustrated in FIG. 2(c), each D.C. output voltage $E_A$ or $E_B$ presents a double-humped characteristic, and its level is higher than the corresponding component $E_1'$ or $E_2'$ led through the coupling capacitor 5. As illustrated in FIG. 2(d), therefore, the composite output voltage $E_o$ presents an S-shaped characteristic which has an abrupt gradient in the vicinity of the center frequency $f_0$.

Figure 2B:
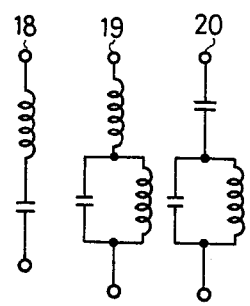
FIG. 2(b) shows examples of circuits having series resonance characteristics.
Figure 2C:
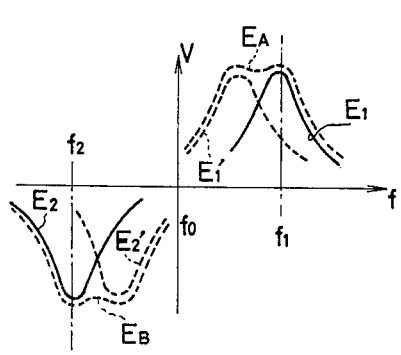
FIGS. 2(c) and 2(d) are graphs illustrative of the characteristics of the discriminator circuit shown in FIG. 2(a).
Figure 2D:
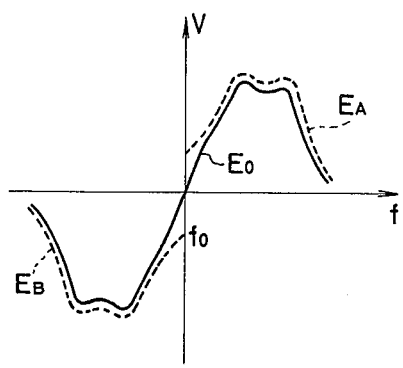

Although it has been described that the circuit 18 shown in FIG. 2(b) is employed for each of the series resonance circuits 3 and 4, it is a matter of course that a similar beneficial result is obtained when another circuit having a series resonance characteristic, such as that of a circuit 19 or 20 in FIG. 2(b), is used.

As set forth above in connection with the embodiment, according to this invention, in the Foster-Seeley discriminator circuit, circuits having series resonance characteristics are connected between a signal source and both end parts of a discriminating resonance circuit, and signals are led from the signal source to detector diodes through both a coupling capacitor and a circuit having a series resonance characteristic, to make the level of the composite output voltage of the discriminator circuit high, whereby the gradient of an S-shaped characteristic in the vicinity of a center frequency can be made abrupt. Since the invention merely adds the simple circuits having the series resonance characteristics, it can improve the output voltage versus frequency-sensitivity at low cost and without incurring any complicated problem.

It is to be understood that various modifications and alterations can be made without departing from the spirit and scope of the following claims.

I claim:

1. In a Foster-Seeley discriminator circuit having a signal source and a discriminating resonance circuit, the improvement comprising a first resonance circuit connected between one end of said discriminating resonance circuit and said signal source, and a second resonance circuit connected between the other end of said discriminating resonance circuit and said signal source.

2. A frequency discriminator circuit according to claim 1, wherein said first and second resonance circuits each have a series resonance characteristic.

3. A frequency discriminator circuit according to claim 1, wherein a resonance frequency of said first resonance circuit is set to be higher than a center frequency of said discriminating resonance circuit, while a resonance frequency of said second resonance circuit is set to be lower than the center frequency of said discriminating resonance circuit.

4. A frequency discriminator circuit according to claim 3, wherein the center frequency $f_0$ of said discriminating resonance circuit, the resonance frequency $f_1$ of said first resonance circuit and the resonance frequency $f_2$ of said second resonance circuit have the relation of $f_1 - f_0 = f_0 - f_2$.

5. A frequency discriminator circuit according to claim 1, wherein each of said first and second resonance circuits includes a coil and a capacitor connected in series.

6. A frequency discriminator circuit according to claim 1, wherein each of said first and second resonance circuits includes a coil connected in series with a parallel circuit of a capacitor and a coil.

7. A frequency discriminator circuit according to claim 1, wherein each of said first and second resonance circuits includes a capacitor connected in series with a parallel circuit of a capacitor and a coil.

* * * * *

UNITED STATES PATENT AND TRADEMARK OFFICE
CERTIFICATE OF CORRECTION

PATENT NO. : 4,254,378
DATED : March 3, 1981
INVENTOR(S) : Susumu Ushida

It is certified that error appears in the above—identified patent and that said Letters Patent is hereby corrected as shown below:

On the title page the assignee should correctly read -- Alps Electric Co., Ltd., Tokyo, Japan -- and "Attorney, Agent, or Firm" should read -- Guy W. Shoup and Gerard F. Dunne --.

Signed and Sealed this

Sixteenth Day of June 1981

[SEAL]

Attest:

RENE D. TEGTMEYER

Attesting Officer

Acting Commissioner of Patents and Trademarks